(12) United States Patent
Nagata et al.

(10) Patent No.: US 10,130,020 B2
(45) Date of Patent: Nov. 13, 2018

(54) INSTALLATION POSITION OPTIMIZATION PROGRAM

(71) Applicant: FUJI CORPORATION, Chiryu (JP)

(72) Inventors: Masaaki Nagata, Okazaki (JP); Hirotoshi Yamane, Kasugai (JP)

(73) Assignee: FUJI CORPORATION, Chiryu (JP)

( * ) Notice: Subject to any disclaimer, the term of this patent is extended or adjusted under 35 U.S.C. 154(b) by 102 days.

(21) Appl. No.: 15/023,613

(22) PCT Filed: Oct. 9, 2013

(86) PCT No.: PCT/JP2013/077426
§ 371 (c)(1),
(2) Date: Mar. 21, 2016

(87) PCT Pub. No.: WO2015/052788
PCT Pub. Date: Apr. 16, 2015

(65) Prior Publication Data
US 2016/0212900 A1   Jul. 21, 2016

(51) Int. Cl.
*H05K 13/08*   (2006.01)
*G05B 19/418*   (2006.01)
*H05K 13/04*   (2006.01)

(52) U.S. Cl.
CPC ........... *H05K 13/08* (2013.01); *G05B 19/418* (2013.01); *H05K 13/0404* (2013.01);
(Continued)

(58) Field of Classification Search
CPC ........ G05B 19/418; G05B 2219/36195; G05B 2219/45026; H05K 13/0404; H05K 13/0417; H05K 13/08
(Continued)

(56) References Cited

U.S. PATENT DOCUMENTS

| 4,657,158 A | * | 4/1987 | Faes ................... H05K 13/0417 221/197 |
| 6,610,991 B1 | * | 8/2003 | Case ................... G01B 11/024 250/559.19 |

(Continued)

FOREIGN PATENT DOCUMENTS

| JP | 2004-6512 A | 1/2004 |
| JP | 2004-128400 A | 4/2004 |

(Continued)

OTHER PUBLICATIONS

Office Action dated Jul. 11, 2017 in Japanese Patent Application No. 2015-541347 with unedited computer generated English translation.
(Continued)

*Primary Examiner* — Kenneth M Lo
*Assistant Examiner* — Chad Erdman
(74) *Attorney, Agent, or Firm* — Oblon, McClelland, Maier & Neustadt, L.L.P.

(57) ABSTRACT

A mounting head is formed of a main body section and a plurality of nozzle holding units, and each of the plurality of nozzle holding units is mounted to the main body section in an exchangeable manner. The height of a suction nozzle when the mounting head is moving over a circuit board is different for each of the plurality of nozzle holding units. In a mounting machine using such a mounting head, due to an installation position optimization program being executed, an installation position of a tape feeder in which electronic components which are scheduled to be mounted to the circuit board which is conveyed by one of a pair of conveyance devices are stored is set to a tape feeder installation table of a supply device of a side close to the one conveyance device of the pair of supply devices.

4 Claims, 10 Drawing Sheets

(52) U.S. Cl.
CPC .................... *H05K 13/0417* (2013.01); *G05B 2219/36195* (2013.01); *G05B 2219/45026* (2013.01)

(58) Field of Classification Search
USPC .................................................. 29/701, 709
See application file for complete search history.

(56) References Cited

U.S. PATENT DOCUMENTS

| | | | | |
|---|---|---|---|---|
| 6,948,232 | B1* | 9/2005 | Yazawa | H05K 13/0413 29/739 |
| 6,971,161 | B1* | 12/2005 | Maenishi | H05K 13/04 29/739 |
| 2004/0073322 | A1* | 4/2004 | Maenishi | H05K 13/0452 700/28 |
| 2005/0268460 | A1* | 12/2005 | Case | H05K 13/02 29/833 |
| 2006/0075631 | A1* | 4/2006 | Case | H05K 13/08 29/709 |
| 2009/0119904 | A1 | 5/2009 | Yamasaki et al. | |
| 2010/0325860 | A1* | 12/2010 | Maenishi | H05K 13/08 29/407.01 |
| 2012/0253499 | A1* | 10/2012 | Nakamura | H05K 13/0417 700/121 |
| 2012/0317802 | A1* | 12/2012 | Yamamoto | H05K 13/021 29/832 |
| 2012/0317803 | A1 | 12/2012 | Kitagawa et al. | |
| 2014/0300730 | A1* | 10/2014 | Onishi | G01B 11/14 348/95 |

FOREIGN PATENT DOCUMENTS

| | | |
|---|---|---|
| JP | 2007-165360 A | 6/2007 |
| JP | 2009-152638 A | 7/2009 |
| JP | 2010-34571 A | 2/2010 |
| JP | 2011-146559 A | 7/2011 |
| JP | 2012-151331 A | 8/2012 |
| WO | 2013/128584 A1 | 9/2013 |

OTHER PUBLICATIONS

International Search Report dated Nov. 19, 2013 in PCT/JP13/077426 Filed Oct. 9, 2013.
Extended European Search Report dated Sep. 16, 2016 in Patent Application No. 13895416.9.
Combined Chinese Office Action and Search Report dated Apr. 8, 2018 in Patent Application No. 201380080111.1 (with English language translation and English translation of categories of cited documents).

* cited by examiner

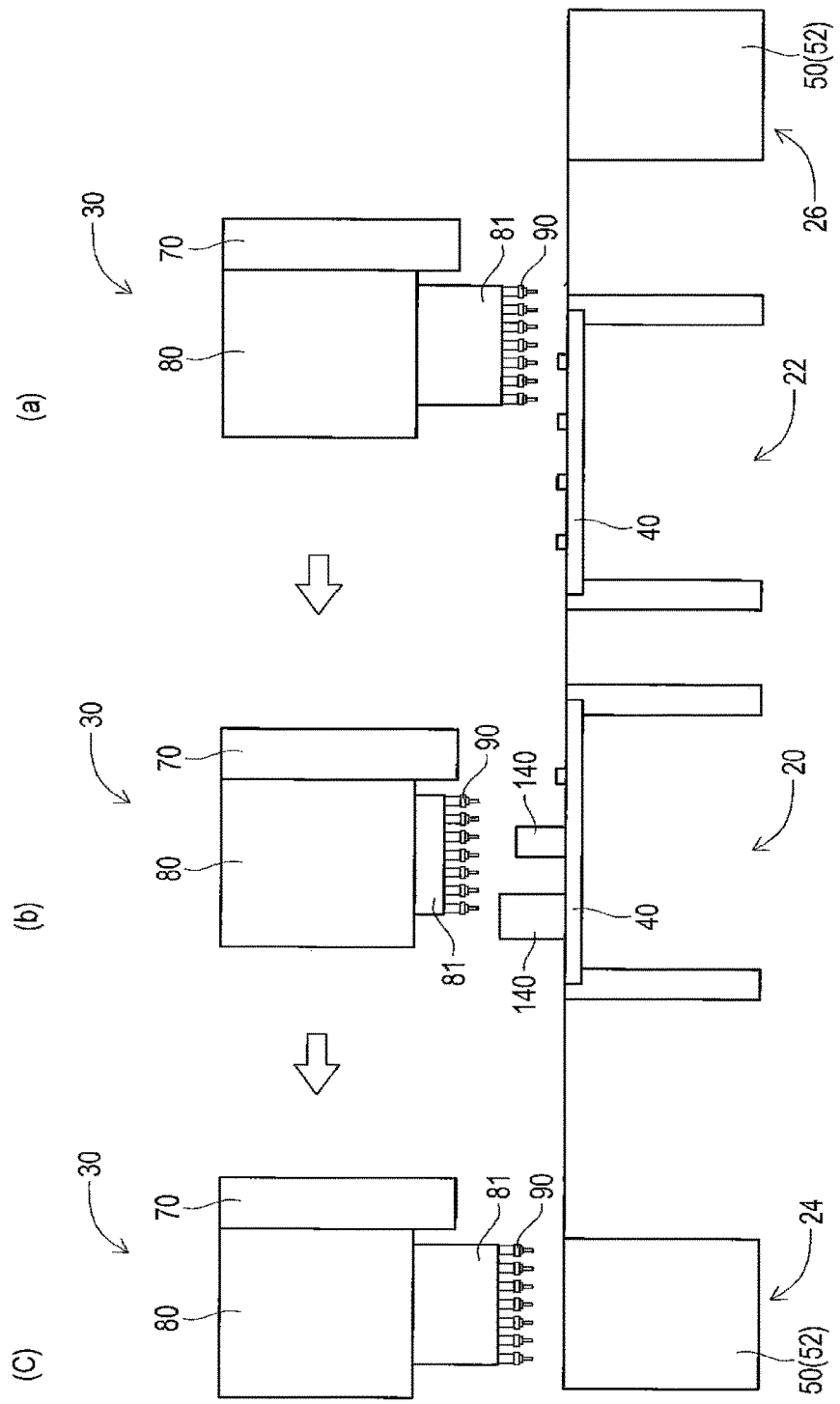

INSTALLATION POSITION OPTIMIZATION PROGRAM

TECHNICAL FIELD

The present disclosure relates to an installation position optimization program which optimizes installation positions of feeders on a feeder installation section of a component supply device in an electronic component mounting machine.

BACKGROUND ART

As described in the patent literature below, amounting machine provided with a pair of conveyance devices which convey circuit boards, a mounting head which performs mounting operation of electronic components on a circuit board, a moving device which moves the mounting head to an arbitrary position, and a pair of component supply devices which supply electronic components using feeders which are installed in feeder installation sections is present in an electronic component mounting machine.

PTL 1: JP-A-2004-128400

DISCLOSURE

Technical Problem

According to the electronic component mounting machine described in the patent literature above, it is possible to mount electronic components which are supplied from each of the pair of component supply devices onto each of the circuit boards which are conveyed by a pair of conveyance devices, and it is possible to efficiently perform mounting operation. However, in order to perform efficient mounting operation, it is necessary to appropriately set the installation positions of the feeders on the feeder installation sections. Specifically, for example, it is necessary to set the installation positions in consideration of the mounting order, the mounting positions, the movement distance of the mounting head, and the like, for example.

In particular, in recent years, a mounting head formed of a main body section which is held to be capable of being moved to an arbitrary position by a moving device, and a plurality of nozzle holding units which hold one or more suction nozzles has been developed, and it is possible to exchange each of the plurality of nozzle holding units in the main body section. The height (hereinafter, there are cases in which this is described as the "nozzle height") of a tip portion of a suction nozzle from a top surface of a circuit board when the mounting head is moved by the moving device over the circuit board in a state in which the nozzle holding unit is mounted to the main body section is different for each of the plurality of nozzle holding units. In an electronic component mounting machine using such a mounting head, the nozzle holding unit which is mounted to the main body section is changed according to the size of the electronic components which are mounted onto the circuit board. Therefore, for example, although detailed description will be given later, during mounting operation on a circuit board which is conveyed by one of the conveyance devices, when moving the mounting head across the other conveyance device, there is a concern that a nozzle holding unit with a low nozzle height will collide with the electronic components of the circuit board which is conveyed by the other conveyance device. The present disclosure was made in light of these issues, and an object thereof is to set the installation positions of the feeders such that, during the mounting operation on the circuit board which is conveyed by one of the pair of conveyance devices, it is possible to prevent collisions and the like between the electronic components of the circuit board which is conveyed by the other conveyance device and the nozzle holding unit.

Solution to Problem

In order to solve the problem described above, an embodiment of the present application provides an installation position optimization program which optimizes installation positions of a feeder on each feeder installation section of a pair of component supply devices in an electronic component mounting machine including a pair of conveyance devices which convey circuit boards, a mounting head which performs mounting operation of electronic components on the circuit boards, a moving device which moves the mounting head to an arbitrary position, and the pair of component supply devices, each of which includes the feeder installation section on which one or more of the feeders which store electronic components is installed in a detachable manner and supplies electronic components at a supply position of the electronic components of the feeder, in which the pair of component supply devices is installed to interpose the pair of conveyance devices, in which the mounting head includes a main body section which is held by the moving device to be capable of moving to an arbitrary position, and a plurality of nozzle holding units which hold one or more suction nozzles, in which each of the plurality of nozzle holding units is mounted in the main body section in an exchangeable manner, in which a nozzle height which is a height of a tip portion of the one or more suction nozzles from a top surface of the circuit board when the mounting head is moved above the circuit board by the moving device in a state in which the nozzle holding unit is mounted in the main body section is different for each of the plurality of nozzle holding units, and in which the installation position optimization program includes a first installation position allocation step of allocating an installation position of one or more specific feeders which is the feeder that stores the electronic components which are scheduled to be mounted onto the circuit board which is conveyed by one of the pair of conveyance devices to the feeder installation section of a first component supply device which is the component supply device which is close to the one of the pair of conveyance devices of the pair of component supply devices.

An embodiment provides the installation position optimization program, further including a second installation position allocation step of allocating the installation position of the feeder which stores the electronic components which are scheduled to be held by the one or more nozzles of the nozzle holding unit with the greatest nozzle height of the one or more specific feeders, in a case in which the number of the one or more specific feeders exceeds the number of feeders which are installed on the feeder installation section of the first component supply device, to the feeder installation section of a different component supply device from the first component supply device of the pair of component supply devices.

An embodiment provides the installation position optimization program, further including a third installation position allocation step of allocating the installation position of the feeder which stores the electronic components which are scheduled to be held by the one or more nozzles of a nozzle holding unit other than the nozzle holding unit with the lowest nozzle height of the one or more specific feeders, in a case in which the number of the one or more specific feeders exceeds the number of feeders which are installed on the feeder installation section of the first component supply device and the electronic components which are scheduled to be mounted onto the circuit board which is conveyed by the other of the pair of conveyance devices are the electronic components which are scheduled to be held by the one or more nozzles of the nozzle holding unit with the lowest nozzle height, to the feeder installation section of a different component supply device from the first component supply device of the pair of component supply devices.

Advantageous Effects

Due to the installation position optimization program according to an embodiment being executed, the installation position of the specific feeder is set to the feeder installation section of the component supply device of the side close to the one conveyance device of the pair of component supply devices. Due to a worker installing the feeder in the feeder installation section according to the settings, it is no longer necessary to move the mounting head across the other conveyance device during the mounting operation of the circuit board which is conveyed by one of the pair of conveyance devices. Accordingly, it is possible to prevent collisions and the like between the electronic components of the circuit board which is conveyed by the other conveyance device and the nozzle holding unit during mounting operation on the circuit board which is conveyed by one of the pair of conveyance devices.

Due to the execution of the installation position optimization program according to an embodiment, in a case in which the number of specific feeders exceeds the number of feeders which are installed on the feeder installation section, only the installation position of the feeder in which the electronic components which are scheduled for mounting operation by the nozzle holding unit with the greatest nozzle height of the specific feeders is set to the feeder installation table of the component supply device of the side far from the one conveyance device of the pair of component supply devices. In other words, only during the mounting operation by the nozzle holding unit with the high nozzle height on the circuit board which is conveyed by one of the pair of conveyance devices, the mounting head is moved across the other conveyance device. Therefore, even if the mounting head is moved across the conveyance device, the nozzle holding unit passes over the electronic components of the circuit board which is conveyed by the conveyance device. Accordingly, it is possible to prevent collisions and the like between the electronic components of the circuit board which is conveyed by the other conveyance device and the nozzle holding unit during mounting operation on the circuit board which is conveyed by one of the pair of conveyance devices.

Due to the execution of the installation position optimization program according to an embodiment, in a case in which the number of specific feeders exceeds the number of feeders which are installed on the feeder installation section and the electronic components which are scheduled to be mounted onto the circuit board which is conveyed by the other conveyance device are the electronic components which are scheduled for the mounting operation by the nozzle holding unit with the lowest nozzle height, only the installation position of the feeder in which the electronic components which are scheduled for mounting operation by the nozzle holding unit 112 other than the nozzle holding unit with the lowest nozzle height of the specific feeders is set to the feeder installation table of the component supply device of the side far from the one conveyance device of the pair of component supply devices. The nozzle holding unit with the lowest nozzle height ordinarily performs the mounting operation of small electronic components. In other words, during mounting operation on the circuit board which is conveyed by one of the pair of conveyance devices, only the small electronic components are mounted onto the circuit board which is crossed by the movement of the mounting head. Therefore, even if the mounting head is moved across the circuit board on which only the small electronic components are mounted, if the nozzle holding unit has a high nozzle height, the nozzle holding unit passes over the electronic components of the circuit board. Accordingly, it is possible to prevent collisions and the like between the electronic components of the circuit board which is conveyed by the other conveyance device and the nozzle holding unit during mounting operation on the circuit board which is conveyed by one of the pair of conveyance devices.

BRIEF DESCRIPTION OF DRAWINGS

FIG. 10 is a diagram illustrating the conditions in which the mounting head is moved during mounting operation in the electronic component mounting machine.

DESCRIPTION OF EMBODIMENTS

Hereinafter, detailed description will be given of the example of the present disclosure with reference to the drawings as a mode for carrying out the present disclosure.
<Configuration of Electronic Component Mounting Machine>

Figure 1:
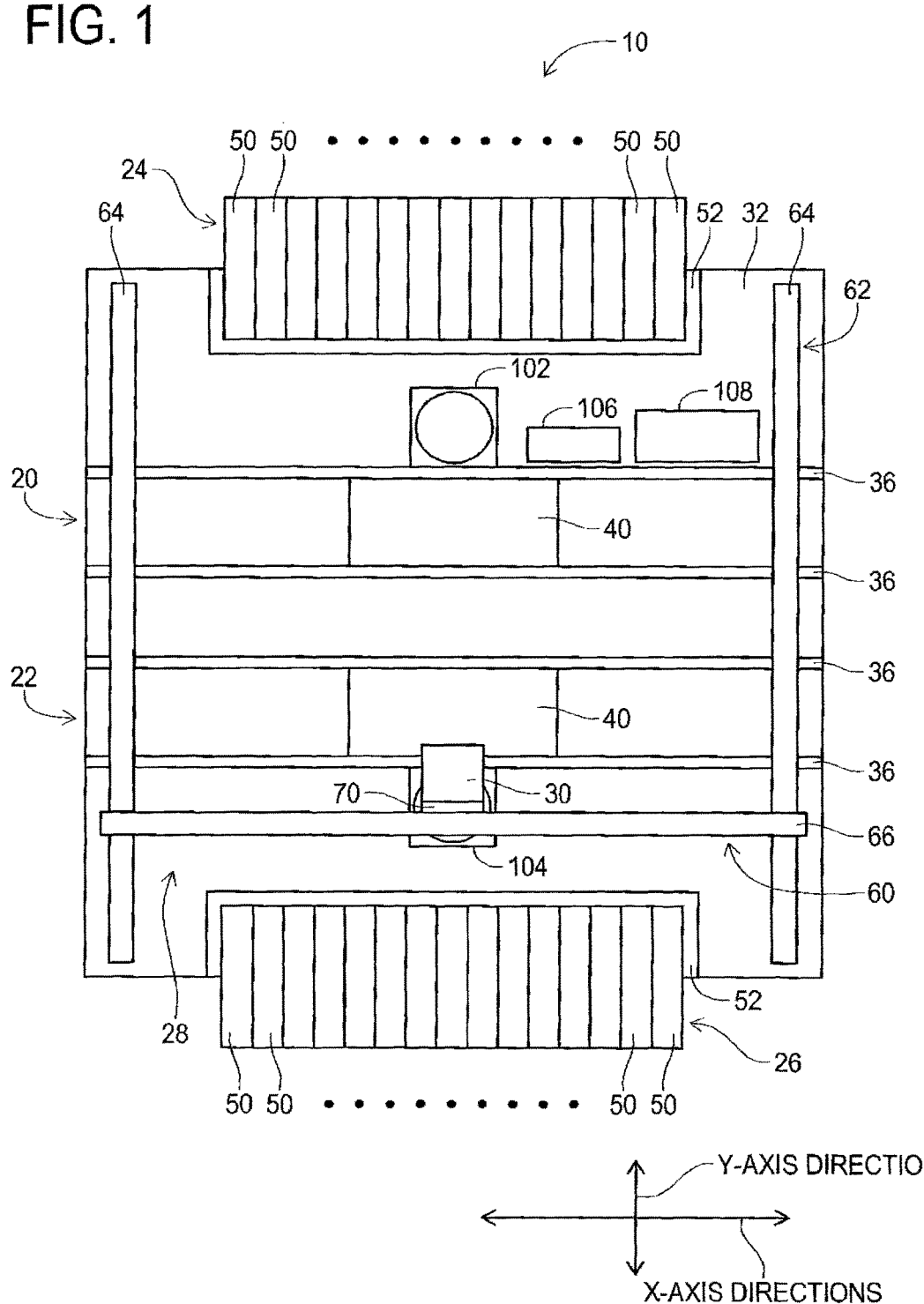
FIG. 1 is a plan view illustrating an electronic component mounting machine.

FIG. 1 illustrates an electronic component mounting machine (hereinafter, there are cases in which this is shortened to the "mounting machine") 10 of an example of the present disclosure. The mounting machine 10 is provided with a pair of conveyance devices 20 and 22, a pair of supply devices 24 and 26, a mounting head moving device (hereinafter, there are cases in which this is shortened to the "moving device") 28, and a mounting head 30.

The pair of conveyance devices 20 and 22 are installed on a base 32 to be parallel to each other and to extend in the X-axis directions. The pair of conveyance devices 20 and 22 are configured in the same manner as each other, and are installed symmetrically along the Y-axis directions. Each of the pair of conveyance devices 20 and 22 includes a pair of conveyor belts 36 which extend in the X-axis directions, and a conveyance motor (refer to FIG. 9) 38 which causes the conveyor belts 36 to revolve. The circuit board 40 is supported by the pair of conveyor belts 36 and is transported in the X-axis directions by the driving of the conveyance motor 38. Each of the pair of conveyance devices 20 and 22 includes a board holding device (refer to FIG. 9) 48. The board holding device 48 holds the circuit board 40 which is supported by the conveyor belts 36 in a fixed manner in a predetermined position (the position in which the circuit board 40 is depicted in FIG. 1). Note that, when distinguishing between the conveyance device 20 and the conveyance device 22, there are cases in which one conveyance device (the conveyance device which is positioned at the top in FIG. 1) of the pair of conveyance devices 20 and 22 is referred to as the first conveyance device 20, and the other conveyance device (the conveyance device which is positioned at the bottom in FIG. 1) is referred to as the second conveyance device 22.

The pair of supply devices 24 and 26 are installed on both side portions of the base 32 in the Y-axis directions so as to interpose the pair of conveyance devices 20 and 22. Each of the supply devices 24 and 26 includes tape feeders 50. The tape feeder 50 accommodates taped components in a wound state. The taped components are obtained by taping the electronic components. The tape feeder 50 feeds out the taped components using a feed device (refer to FIG. 9) 51. Accordingly, each of the supply devices 24 and 26 supplies the electronic components to the supply position by feeding out the taped components. Note that, when distinguishing between the supply device 24 and the supply device 26, there are cases in which one supply device (the supply device which is installed on the side near to the first conveyance device 20 in FIG. 1) of the pair of supply devices 24 and 26 is referred to as the first supply device 24, and the other supply device (the supply device which is installed on the side near to the second conveyance device 22 in FIG. 1) is referred to as the second supply device 26.

Figure 2:
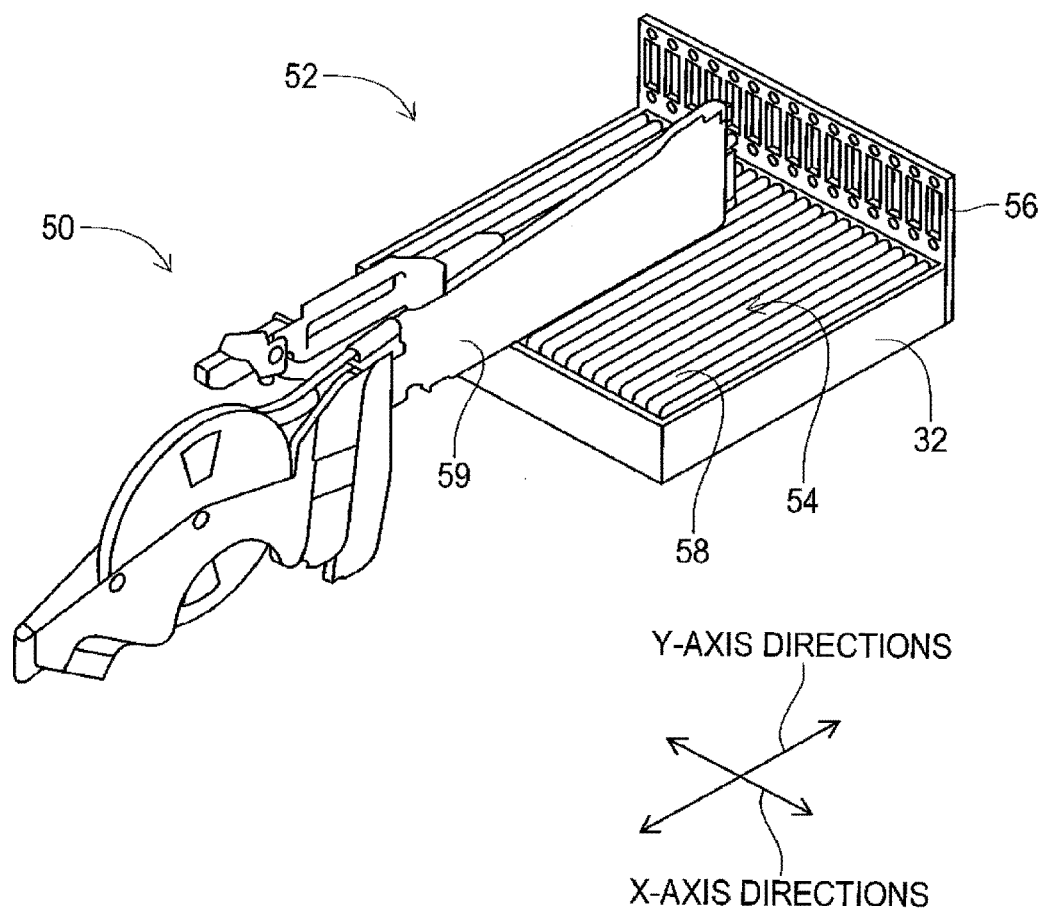
FIG. 2 is a perspective diagram illustrating a tape feeder and a tape feeder installation table which are provided in the electronic component mounting machine.

The tape feeder 50 is configured to be attachable to and detachable from the tape feeder installation table 52 which is provided on the side portion of the base 32 in the Y-axis directions in a fixed manner. In detail, as illustrated in FIG. 2, the tape feeder installation table 52 is formed of slide sections 54 which are provided on the top surface of the base 32, and a standing surface section 56 which stands on the end portion of the slide section 54. A plurality of slide grooves 58 are formed in the slide section 54 to extend in the Y-axis directions. Meanwhile, a rail (not illustrated) is provided on the bottom end portion of a main body section 59 of the tape feeder 50. The side wall surface of the main body section 59 is attached to the standing surface section 56 by sliding the tape feeder 50 in a direction approaching the standing surface section 56 in a state in which the rail of the main body section 59 fits with the slide groove 58. Accordingly, the tape feeder 50 is installed on the tape feeder installation table 52. Meanwhile, the tape feeder 50 is removed from the tape feeder installation table 52 by sliding the tape feeder 50 in a direction distancing from the standing surface section 56.

The moving device 28 is formed of an X-axis direction slide mechanism 60 and a Y-axis direction slide mechanism 62. The Y-axis direction slide mechanism 62 includes a pair of Y-axis direction guide rails 64 which extend in the Y-axis directions. Meanwhile, the X-axis direction slide mechanism 60 includes an X-axis direction guide rail 66 which extends in the X-axis directions. The X-axis direction guide rail 66 bridges over the pair of Y-axis direction guide rails 64. The Y-axis direction slide mechanism 62 includes a Y-axis motor (refer to FIG. 9) 65, and the X-axis direction guide rail 66 is moved to an arbitrary position in the Y-axis directions by the driving of the Y-axis motor 65. The X-axis direction guide rail 66 holds a slider 70 such that the slider 70 is capable of moving along the axial line of the X-axis direction guide rail 66. The X-axis direction slide mechanism 60 includes an X-axis motor (refer to FIG. 9) 72, and the slider 70 is moved to an arbitrary position in the X-axis directions by the driving of the X-axis motor 72. The mounting head 30 is attached to the slider 70. According to this structure, the mounting head 30 is moved to an arbitrary position on the base 32 by the moving device 28. The mounting head 30 is configured to be attachable to and detachable from the slider 70 in a single operation.

Figure 3:
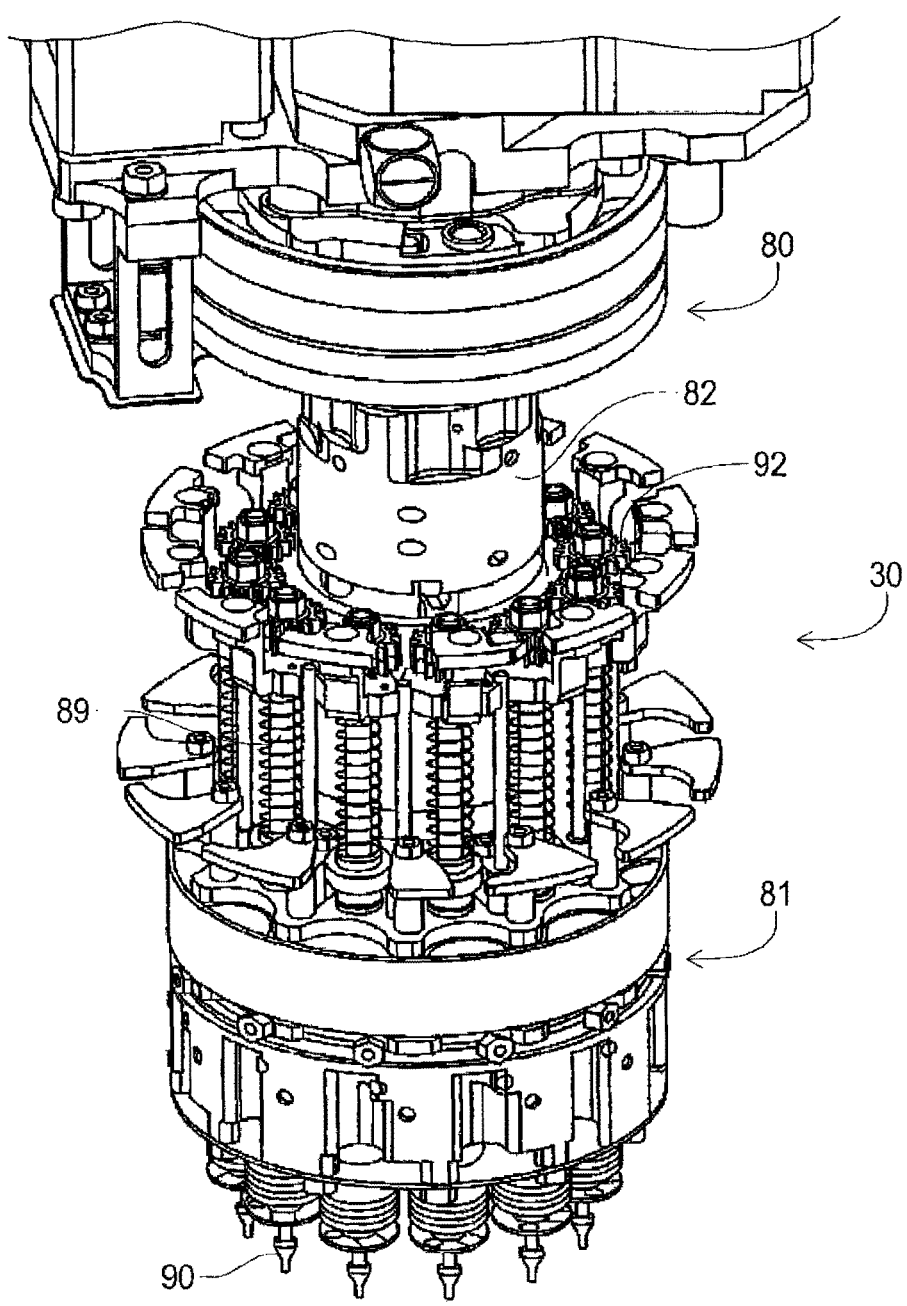
FIG. 3 is a perspective diagram illustrating a mounting head which is provided in the electronic component mounting machine.
Figure 4:
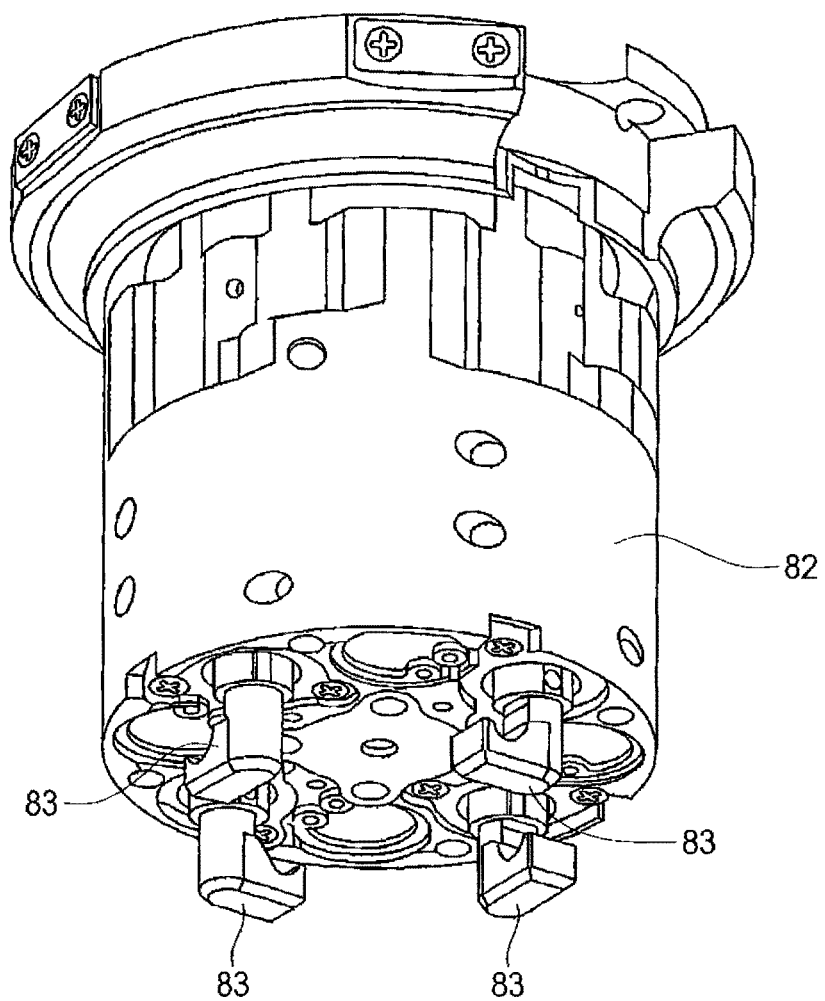
FIG. 4 is a perspective diagram illustrating a rotating body which is included in the mounting head.

The mounting head 30 is a work head for holding an electronic component and performing mounting operation of the electronic component onto the circuit board. As illustrated in FIG. 3, the mounting head 30 is formed of a main body section 80 and a nozzle holding unit 81. The main body section 80 is held by the slider 70 in a fixed manner and includes a substantially columnar rotating body 82. The rotating body 82 extends downward in a state in which the axial center of the rotating body 82 is extending in the up-down directions, and is capable of rotating around the axial center. As illustrated in FIG. 4, four locking claws 83 are fixed to the bottom surface of the rotating body 82.

Figure 5:
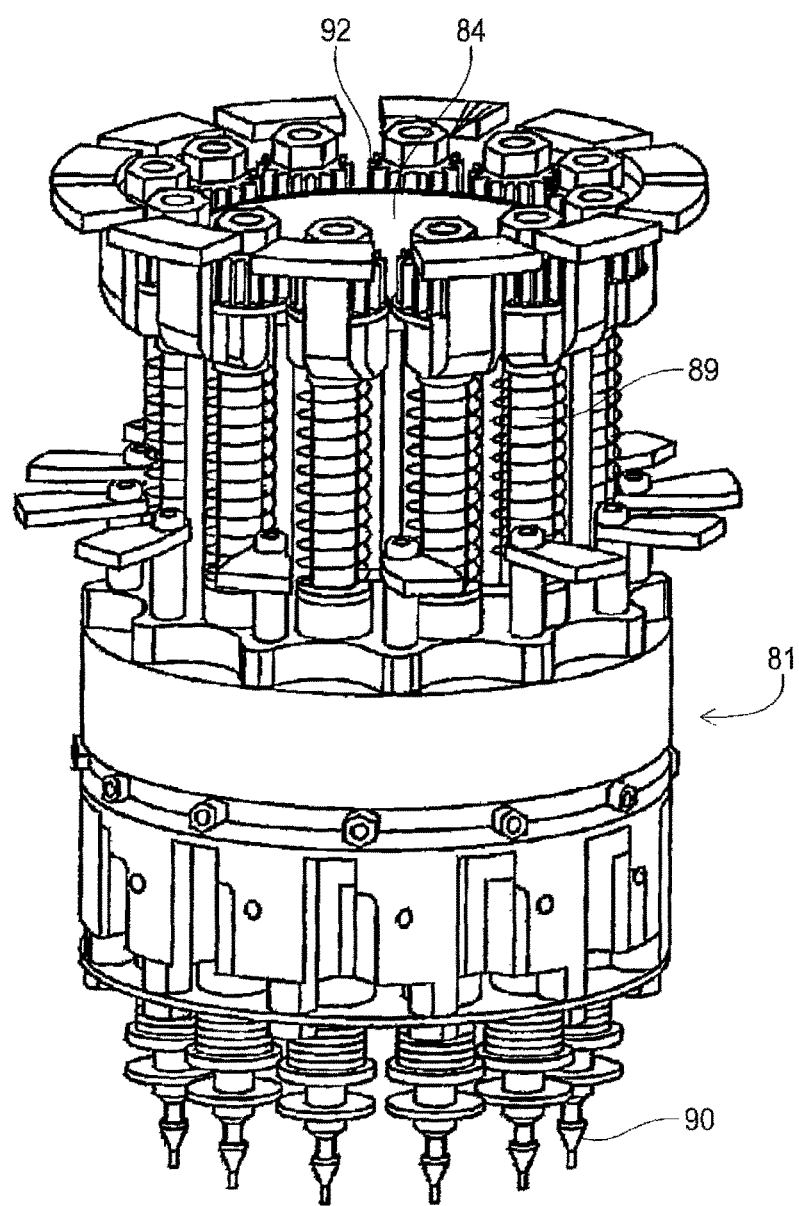
FIG. 5 is a perspective diagram illustrating a first nozzle holding unit which is included in the mounting head.
Figure 6:
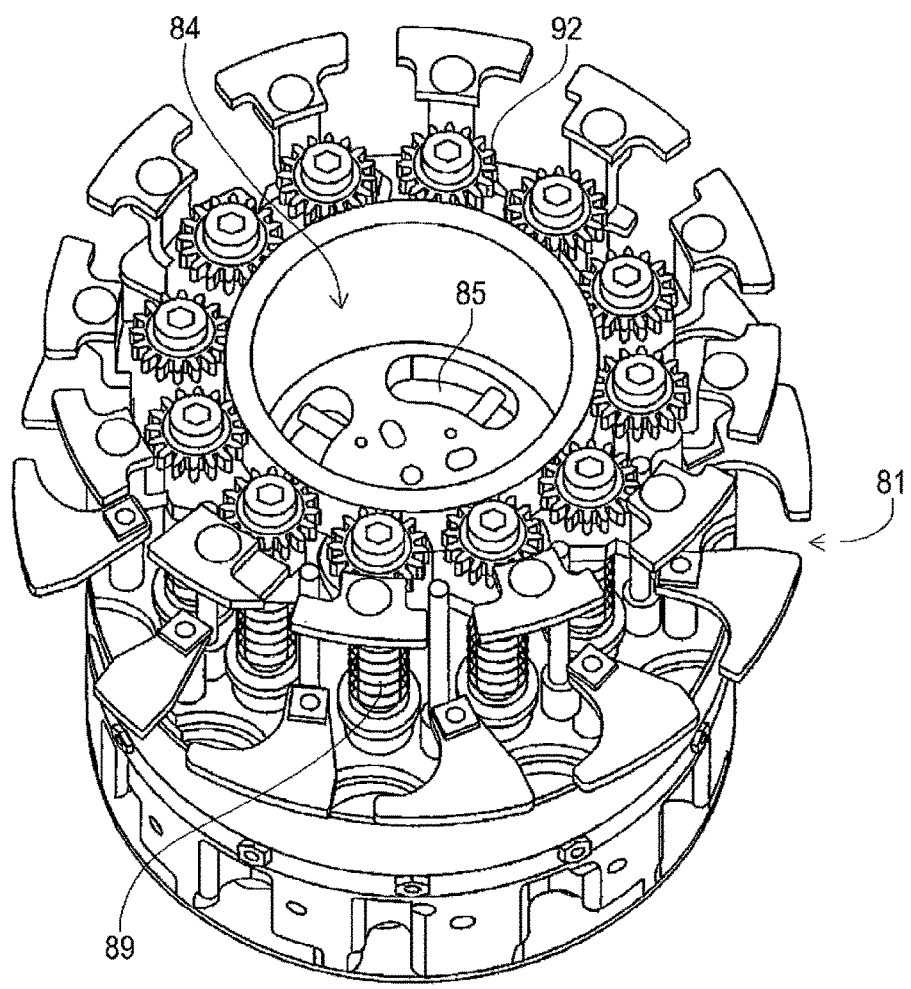
FIG. 6 is a perspective diagram illustrating the first nozzle holding unit which is included in the mounting head.

Meanwhile, as illustrated in FIGS. 5 and 6, the nozzle holding unit 81 is also substantially columnar. A bottomed hole 84 with an inner diameter slightly larger than the outer diameter of the rotating body 82 is formed in the inner portion of the nozzle holding unit 81. Locked sections 85 onto which lock the locking claws 83 of the rotating body 82 are formed in the bottom face of the bottomed hole 84. The nozzle holding unit 81 is mounted to the main body section 80 by fitting the rotating body 82 into the bottomed hole 84 and locking the locking claws 83 in the locked sections 85. The nozzle holding unit 81 is removed from the main body section 80 by releasing the locking of the locking claws 83 in the locked sections 85 and pulling the rotating body 82 from the bottomed holes 84. In other words, the nozzle holding unit 81 is configured to be attachable to and detachable from the main body section 80.

The main body section 80 includes a unit rotating motor (refer to FIG. 9) 87 for rotating the rotating body 82, and the nozzle holding unit 81 rotates with the rotating body 82 due to the driving of the unit rotating motor 87. The main body section 80 includes a unit lifting and lowering motor (refer to FIG. 9) 88 for lifting and lowering the rotating body 82, and the nozzle holding unit 81 moves in the up-down directions due to the driving of the unit lifting and lowering motor 88. Note that, FIG. 3 is a diagram illustrating the mounting head 30 directly before the nozzle holding unit 81 is mounted to the main body section 80, that is, directly before the rotating body 82 is fitted into the bottomed holes 84.

The nozzle holding unit 81 includes twelve rod-shaped nozzle holders 89, and a suction nozzle 90 is mounted to the bottom end portion of each of the nozzle holders 89. The suction nozzle 90 is connected to a positive and negative pressure supply device (refer to FIG. 9) 91, sucks and holds an electronic component using a negative pressure, and releases the electronic component using a positive pressure. The twelve nozzle holders 89 are held at an equal pitch on the outer circumferential portion of the nozzle holding unit 81 in a state in which the axial directions thereof are vertical. Each of the suction nozzles 90 extends downward from the bottom surface of the nozzle holding unit 81. Note that, the suction nozzle 90 is configured to be attachable to and detachable from the nozzle holder 89.

A gear 92 is provided on the top end portion of each of the nozzle holders 89, and the plurality of gears 92 mesh with a single gear (omitted from the drawings). A nozzle rotating motor (refer to FIG. 9) 96 for rotating the single gear when the nozzle holding unit 81 is mounted to the main body section 80 is provided in the main body section 80. Each of the nozzle holders 89 rotates around its respective axial center due to the driving of the nozzle rotating motor 96. A nozzle lifting and lowering motor (refer to FIG. 9) 98 for lifting and lowering the nozzle holders 89 to predetermined positions when the nozzle holding unit 81 is mounted to the main body section 80 is provided in the main body section 80. The nozzle holder of the predetermined position moves in the up-down directions due to the driving of the nozzle lifting and lowering motor 98.

The mounting machine 10 is provided with a mark camera (refer to FIG. 9) 100, a pair of parts cameras (refer to FIG. 1) 102 and 104, a nozzle changer (refer to FIG. 1) 106, and a unit changer (refer to FIG. 1) 108. The mark camera 100 is fixed to the bottom surface of the slider 70 in a state of facing downward, and is capable of imaging an arbitrary position of the circuit board 40. As illustrated in FIG. 1, each of the parts cameras 102 and 104 is installed between the first conveyance device 20 and the first supply device 24 or between the second conveyance device 22 and the second supply device 26, and is capable of imaging an electronic component held in the mounting head 30.

Figure 7:
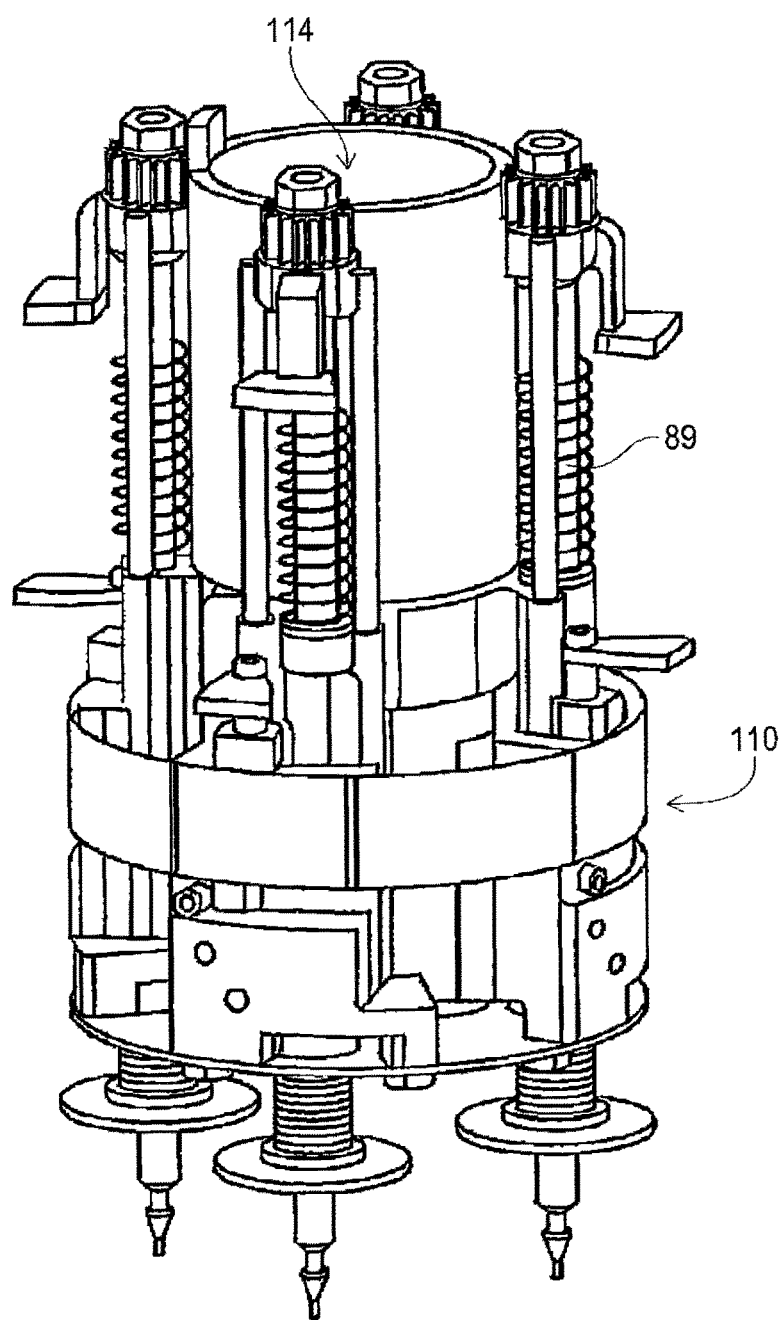
FIG. 7 is a perspective diagram illustrating a second nozzle holding unit which is included in the mounting head.
Figure 8:
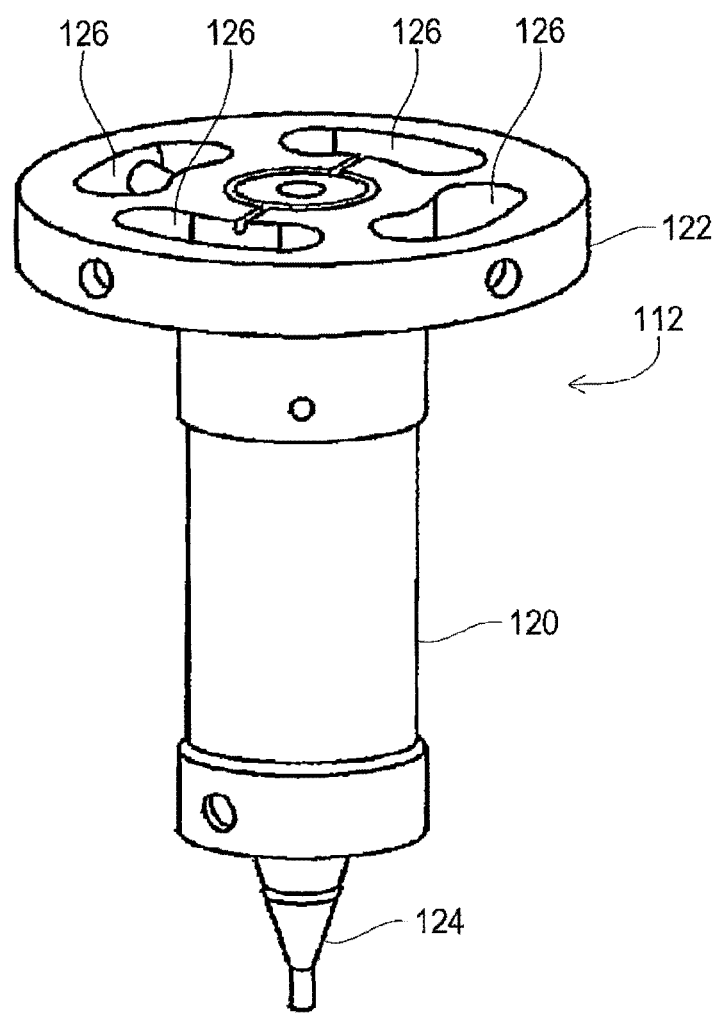
FIG. 8 is a perspective diagram illustrating a third nozzle holding unit which is included in the mounting head.

The plurality of suction nozzles 90 are stored in the nozzle changer 106, and the suction nozzles 90 which are mounted to the nozzle holders 89 of the mounting head 30 are automatically exchanged with the suction nozzles 90 which are stored in the nozzle changer 106. A nozzle holding unit 110 illustrated in FIG. 7 and a nozzle holding unit 112 illustrated in FIG. 8 are stored in the unit changer 108. When distinguishing between the nozzle holding units 81, 110, and 112, there are cases in which the nozzle holding unit 81 is referred to as the first nozzle holding unit 81, the nozzle holding unit 110 is referred to as the second nozzle holding unit 110, and the nozzle holding unit 112 is referred to as the third nozzle holding unit 112.

The second nozzle holding unit 110 has substantially the same structure as the first nozzle holding unit 81 except in that the number of nozzle holders 89 is four. In other words, a bottomed hole 114 of the same shape as the bottomed hole 84 of the first nozzle holding unit 81 is formed in the second nozzle holding unit 110, and locked sections (not illustrated) of the same shape as the locked sections 85 of the first nozzle holding unit 81 are formed in the bottom face of the bottomed hole 114. Accordingly, it is possible to mount the second nozzle holding unit 110 in the main body section 80 by fitting the rotating body 82 into the bottomed hole 114 and locking the locking claws 83 in the locked sections. Note that, the second nozzle holding unit 110 which is mounted to the main body section 80 rotates due to the driving of the unit rotating motor 87 and moves in the up-down directions due to the driving of the unit lifting and lowering motor 88. The nozzle holder 89 of the second nozzle holding unit 110 rotates on the axis of the nozzle holder 89 due to the driving of the nozzle rotating motor 96 and moves in the up-down directions due to the driving of the nozzle lifting and lowering motor 98.

As illustrated in FIG. 8, the third nozzle holding unit 112 is formed of a cylinder portion 120, a flange portion 122 which is provided on the top end portion of the cylinder portion 120, and a suction nozzle 124 which is mounted to the bottom end surface of the cylinder portion 120. Locked sections 126 of the same shape as the locked sections 85 of the first nozzle holding unit 81 are formed in the top surface of the flange portion 122. Accordingly, it is possible to mount the third nozzle holding unit 112 in the main body section 80 by locking the locking claws 83 in the locked sections 126. Note that, the third nozzle holding unit 112 which is mounted to the main body section 80, that is, the suction nozzle 124 rotates due to the driving of the unit rotating motor 87 and moves in the up-down directions due to the driving of the unit lifting and lowering motor 88.

Figure 9:
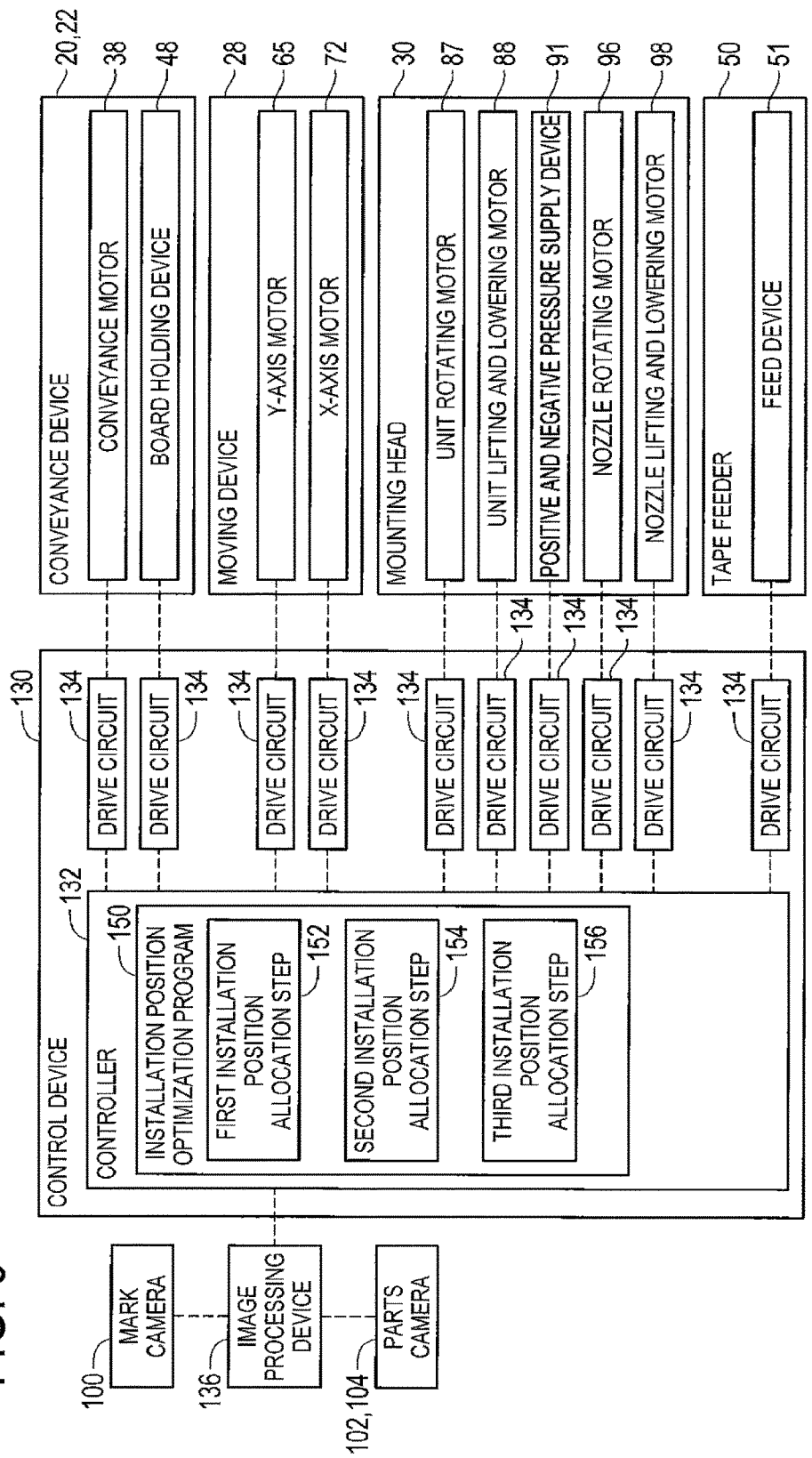
FIG. 9 is a block diagram illustrating a control device with which the electronic component mounting machine is provided.

As illustrated in FIG. 9, the mounting machine 10 is provided with a control device 130. The control device 130 is provided with a controller 132 and a plurality of drive circuits 134. The plurality of drive circuits 134 are connected to the conveyance motor 38, the board holding device 48, the feed device 51, the Y-axis motor 65, the X-axis motor 72, the unit rotating motor 87, the unit lifting and lowering motor 88, the positive and negative pressure supply device 91, the nozzle rotating motor 96, and the nozzle lifting and lowering motor 98. The controller 132 is provided with a CPU, a ROM, a RAM, and the like, the main constituent of the controller 132 is a computer, and the controller 132 is connected to the plurality of drive circuits 134. Accordingly, the operations of the conveyance devices 20 and 22, the moving device 28, and the like are controlled by the controller 132. The controller 132 is also connected to an image processing device 136. The image processing device 136 processes the image data which is obtained by the mark camera 100 and the parts cameras 102 and 104, and the controller 132 acquires various information from the image data.

<Mounting Operation of Mounting Machine>

According to the configuration which is described above, in the mounting machine 10, it is possible to perform the mounting operation on the circuit board 40 which is held in the conveyance devices 20 and 22 using the mounting head 30. However, in the mounting machine 10, the nozzle holding unit 81, 110, or 112 which is mounted to the main body section 80 is changed according to the size of the electronic components which are mounted onto the circuit board 40.

Specifically, first, to mount small electronic components on the circuit board 40, the first nozzle holding unit 81 is mounted to the main body section 80. According to the instructions of the controller 132, the circuit board 40 is conveyed to a working position, and at this position, the circuit board 40 is held in a fixed manner by the board holding device 48. Next, the mark camera 100 moves to above the circuit board 40 and images the circuit board 40 according to the instructions of the controller 132. Accordingly, the controller 132 acquires information relating to the error of the holding position of the circuit board. The tape feeder 50 feeds the taped components and supplies the electronic components to the supplying position according to the instructions of the controller 132. The mounting head 30 moves to above the supplying position of the electronic components and sucks and holds the electronic component using the suction nozzle 90 according to the instructions of the controller 132. Next, the mounting head 30 moves to above the parts cameras 102 and 104, and the parts cameras 102 and 104 image the electronic component which is sucked and held by the suction nozzle 90 according to the instructions of the controller 132. Accordingly, the controller 132 acquires information relating to the error of the suction position of the electronic component. The mounting head 30 moves to above the circuit board 40, the error of the holding position, the error of the suction position and the like of the held electronic component is corrected, and the electronic component is mounted on the circuit board according to the instructions of the controller 132.

Incidentally, in a case in which the first nozzle holding unit 81 is mounted to the main body section 80, the mounting head 30 moves to above the circuit board 40 in a state in which the distance between the mounting head 30 and the circuit board is considerably low. In detail, the mounting head 30 is moved to above the circuit board such that the height (hereinafter, there are cases in which this is shortened to the "nozzle height") of the tip portion of the suction nozzle 90 of the first nozzle holding unit 81 from the top surface of the circuit board 40 is approximately 8 to 9 mm. The nozzle height is a numerical value of a case in which the maximum height dimension of the electronic component which is mounted by the first nozzle holding unit 81 is set to 3 mm, and is set as a value obtained by adding the height (3 mm) of the electronic component which is mounted on the circuit board 40, the height (3 mm) of the electronic component which is held on the suction nozzle 90 of the first nozzle holding unit 81, and a clearance (2 to 3 mm) between the electronic component which is mounted on the circuit board 40 and the electronic component which is held on the suction nozzle 90. In this manner, by moving the mounting head 30 at a position close onto the circuit board 40 and performing the mounting operation, it is possible to reduce the movement distance of the suction nozzle 90 in the up-down directions, and it is possible to shorten the time required for the mounting operation.

When all of the electronic components which are scheduled to be mounted by the first nozzle holding unit 81 are mounted on the circuit board 40, the mounting operation of electronic components which are larger than the electronic components which are scheduled to be mounted by the first nozzle holding unit 81 is performed. In this mounting operation, instead of the first nozzle holding unit 81, the second nozzle holding unit 110 is mounted to the main body section 80. In detail, the mounting head 30 moves to above the unit changer 108 and moves the first nozzle holding unit 81 downward according to the instructions of the controller 132. Next, the mounting head 30 releases the first nozzle holding unit 81 in a predetermined vacant position of the unit changer 108 and mounts the second nozzle holding unit 110 instead of the first nozzle holding unit 81 in the main body section 80 according to the instructions of the controller 132.

When the second nozzle holding unit 110 is mounted in the main body section 80, the mounting operation of electronic components with a height dimension greater than 3 mm and less than or equal to X (>3) mm is performed. Since the mounting operation of the second nozzle holding unit 110 is the same as the mounting operation of the first nozzle holding unit 81 described above, description will be omitted. Note that, the nozzle height of the second nozzle holding unit 110 during the mounting operation of the second nozzle holding unit 110 is set to approximately (2*X+2) mm. The nozzle height is set as a value obtained by adding the height (X mm) of the electronic component which is mounted on the circuit board 40, the height (X mm) of the electronic component which is held on the suction nozzle 90 of the second nozzle holding unit 110, and a clearance (approximately 2 mm) between the electronic component which is mounted on the circuit board 40 and the electronic component which is held on the suction nozzle 90. In this manner, by setting the nozzle height of the second nozzle holding unit 110, even during the mounting operation of an electronic component which is large to an extent onto the circuit board, it is possible to reduce the movement distance of the suction nozzle 90 in the up-down directions as much as possible, and it is possible to shorten the time required for the mounting operation.

When all of the electronic components which are scheduled to be mounted by the second nozzle holding unit 110 are mounted on the circuit board 40, the mounting operation of electronic components which are larger than the electronic components which are scheduled to be mounted by the second nozzle holding unit 110 is performed. In this mounting operation, instead of the second nozzle holding unit 110, the third nozzle holding unit 112 is mounted to the main body section 80. Note that, since the mounting of the third nozzle holding unit 112 to the main body section 80 is the same as the mounting of the second nozzle holding unit 110 described above to the main body section 80, description will be omitted.

When the third nozzle holding unit 112 is mounted in the main body section 80, the mounting operation of electronic components with a height dimension greater than X mm is performed. Since the mounting operation of the third nozzle holding unit 112 is the same as the mounting operation of the first nozzle holding unit 81 described above, description will be omitted. Note that, the nozzle height of the third nozzle holding unit 112 during the mounting operation of the third nozzle holding unit 112 is set to approximately (2*Y+2) mm. The nozzle height is a numerical value of a case in which the maximum height dimension of the electronic component which can be mounted on the circuit board is set to Y mm, and is set as a value obtained by adding the height (Y mm) of the electronic component which is mounted on the circuit board 40, the height (Y mm) of the electronic component which is held on the suction nozzle 124 of the third nozzle holding unit 112, and a clearance (approximately 2 mm) between the electronic component which is mounted on the circuit board 40 and the electronic component which is held on the suction nozzle 124. In this manner, by setting the nozzle height of the third nozzle holding unit 112, even if the electronic component has a height dimension of Y mm, it is possible to appropriately perform the mounting operation on the circuit board.

<Allocation of Installation Positions of Tape Feeders on Tape Feeder Installation Table>

As described above, in the mounting machine 10, the nozzle holding unit 81, 110, or 112 which is mounted to the main body section 80 is changed according to the size of the electronic components which are mounted onto the circuit board 40. Accordingly, it is possible to lower the nozzle height as much as possible according to the size of the electronic components, and it is possible to shorten the time required for the mounting operation. However, in the mounting machine 10, since the electronic components which are supplied by each of the pair of supply devices 24 and 26 are mounted by the single mounting head 30 onto the circuit boards 40 which are conveyed by each of the pair of conveyance devices 20 and 22, there is a concern that the nozzle holding units 81, 110, and 112 will be moved wastefully in the up-down directions, and the time required for the mounting operation will increase.

Specifically, for example, as illustrated in FIG. 10, consideration will be given to a case in which electronic components of the tape feeders 50 which are installed in the tape feeder installation table 52 of the first supply device 24 are mounted by the nozzle holding unit 81 onto the circuit board 40 which is conveyed by the second conveyance device 22. In this case, for example, when electronic components 140 with a height dimension greater than 3 mm are mounted on the circuit board 40 which is conveyed by the first conveyance device 20, there is a concern that the first nozzle holding unit 81 and the electronic components 140 will collide when the mounting head 30 (FIG. 10(*a*)) in a state in which the nozzle height is low is moved toward the first supply device 24. Therefore, as illustrated in FIG. 10(*b*), when the mounting head 30 is moved toward the first supply device 24, it is necessary to move the first nozzle holding unit 81 upward. As illustrated in FIG. 10(*c*), when the electronic component is held by the suction nozzle 90 from the tape feeder 50 of the first supply device 24, it is necessary to move the first nozzle holding unit 81 downward. In this manner, in a case in which it is necessary to move the first nozzle holding unit 81 across the conveyance device during the mounting operation, there is a concern that the time required for the mounting operation will become longer due to wasteful movement of the first nozzle holding unit 81 in the up-down directions.

In light of these issues, the installation position of the tape feeder 50 in which the electronic components (hereinafter, there are cases in which this is referred to as "electronic components of one side") which are scheduled to be mounted onto the circuit board 40 which is conveyed by one of the pair of conveyance devices 20 and 22 are stored is allocated to the tape feeder installation table 52 of the supply device, of the pair of supply devices 24 and 26, on the side which is close to the one conveyance device. In detail, an installation position optimization program (refer to FIG. 9) 150 is stored in the controller 132, and the installation position of the tape feeder 50 on the tape feeder installation table 52 is set by executing the installation position optimization program 150. Specifically, by executing the installation position optimization program 150, the installation position of the tape feeder 50 in which the electronic components which are scheduled to be mounted onto the circuit board 40 which is conveyed by the first conveyance device 20 are stored is set to the tape feeder installation table 52 of the first supply device 24. Specifically, the installation position of the tape feeder 50 in which the electronic components which are scheduled to be mounted onto the circuit board 40 which is conveyed by the second conveyance device 22 are stored is set to the tape feeder installation table 52 of the second supply device 26. Due to a worker installing the tape feeder 50 in the tape feeder installation table 52 according to the settings, it is no longer necessary to move the mounting head 30 across the other conveyance device during the mounting operation of the circuit board 40 which is conveyed by one of the pair of conveyance devices 20 and 22. Accordingly, it is no longer necessary to wastefully move the first nozzle holding unit 81 in the up-down directions, and it is possible to shorten the time required for the mounting operation. Note that, the setting of the installation position is performed by executing a first installation position allocation step (refer to FIG. 9) 152 of the installation position optimization program 150.

For example, there is a case in which the number of electronic components of one side, the types thereof, and the like are many, and the number of tape feeders 50 which store the electronic components of one side exceeds the number of feeders installed on the tape feeder installation table 52. In other words, there is a case in which the number of tape feeders 50 in which the electronic components which are scheduled to be mounted onto the circuit board 40 which is conveyed by the first conveyance device 20 are stored is too many, and it is not possible to install all of the tape feeders 50 in which the electronic components which are scheduled to be mounted are stored in the tape feeder installation table 52 of the first supply device 24. In this case, of the plurality of tape feeders 50 in which the electronic components which are scheduled to be mounted are stored, only the installation positions of the tape feeders 50 in which the electronic components which are scheduled for the mounting operation by the third nozzle holding unit 112, that is, the electronic components in which the height dimension is greater than X mm are stored are set in the tape feeder installation table 52 of the second supply device 26.

In other words, only during the work when an electronic component with a height dimension greater than X mm is mounted onto the circuit board 40 which is conveyed by one of the pair of conveyance devices 20 and 22, the mounting head 30 is moved across the other conveyance device. During the mounting operation of the electronic component with a greater height dimension than X mm, the third nozzle holding unit 112 is mounted in the main body section 80, and the nozzle height of the third nozzle holding unit 112 is set extremely high, as described above. Therefore, even if the mounting head 30 is moved across the conveyance device, the electronic components of the circuit board which is conveyed by the conveyance device and the third nozzle holding unit 112 do not interfere.

Accordingly, for example, in a case in which the number of tape feeders 50 which store the electronic components which are scheduled to be mounted onto the circuit board 40 which is conveyed by the first conveyance device 20 exceeds the number of feeders installed on the tape feeder installation table 52 of the first supply device 24, even if the installation positions of the tape feeders 50 are set to the tape feeder installation table 52 of the second conveyance device 22, it is possible to prevent the wasteful movement of the third nozzle holding unit 112 in the up-down directions. Note that, the setting of the installation position is performed by executing a second installation position allocation step (refer to FIG. 9) 154 of the installation position optimization program 150.

In a case in which the number of the tape feeders 50 which store the electronic components of one side exceeds the number of feeders which are installed on the tape feeder installation table 52, it is possible to set the installation positions of the tape feeders 50 by executing a third installation position allocation step (refer to FIG. 9) 156 which is different from the second installation position allocation step 154. Specifically, in a case in which the number of tape feeders 50 which store the electronic components of one side exceeds the number of feeders installed on the tape feeder installation table 52 and the electronic components (hereinafter, there are cases in which these are referred to as "electronic components of the other side") which are scheduled to be mounted onto the circuit board 40 which is conveyed by the other of the pair of conveyance devices 20 and 22 are electronic components which are scheduled for the mounting operation by the first nozzle holding unit 81, that is, the electronic components with a height dimension of less than or equal to 3 mm, of the plurality of tape feeders 50 in which the electronic components of one side are stored, only the installation positions of the tape feeders 50 in which the electronic components which are scheduled for the mounting operation by the second nozzle holding unit 110 or the third nozzle holding unit 112, that is, the electronic components with a height dimension greater than 3 mm are stored are set to the tape feeder installation table 52 of the other supply device.

In other words, only in a case in which the electronic components with a height dimension less than or equal to 3 mm are mounted on the circuit board 40 which is conveyed by the other of the pair of conveyance devices 20 and 22, the mounting head 30 is moved across the other conveyance device in order to hold the electronic components with a height dimension greater than 3 mm. During the mounting operation of the electronic components with a height dimension greater than 3 mm, the second nozzle holding unit 110 or the third nozzle holding unit 112 is mounted in the main body section 80, and the nozzle height of the second nozzle holding unit 110 or the third nozzle holding unit 112 is, as described above, greater than or equal to (2*X+2) mm (X>3). Here, even if the mounting head 30 is moved across a circuit board on which the electronic components with a height dimension less than or equal to 3 mm are mounted, the electronic components do not interfere with the second nozzle holding unit 110 or the third nozzle holding unit 112.

Accordingly, for example, in a case in which the number of tape feeders 50 which store the electronic components which are scheduled to be mounted onto the circuit board 40 which is conveyed by the first conveyance device 20 exceeds the number of feeders installed on the tape feeder installation table 52 of the first supply device 24 and the electronic components which are scheduled to be mounted onto the circuit board 40 which is conveyed by the second conveyance device 22 are electronic components with a height dimension less than or equal to 3 mm, even if the installation positions of the tape feeders 50 are set to the tape feeder installation table 52 of the second conveyance device 22, it is possible to prevent the wasteful movement of the second nozzle holding unit 110 or the third nozzle holding unit 112 in the up-down directions.

Incidentally, in the example described above, the mounting machine 10 is an example of the electronic component mounting machine. The conveyance devices 20 and 22 are examples of a pair of conveyance devices. The supply devices 24 and 26 are examples of a pair of component supply devices. The moving device 28 is an example of a moving device. The mounting head 30 is an example of a mounting head. The tape feeder 50 is an example of a feeder. The tape feeder installation table 52 is an example of a feeder installation section. The main body section 80 is an example of a main body section. The nozzle holding units 81, 110, and 112 are examples of a nozzle holding unit. The installation position optimization program 150 is an example of an installation position optimization program. The first installation position allocation step 152 is an example of a first installation position allocation step. The second installation position allocation step 154 is an example of a second installation position allocation step. The third installation position allocation step 156 is an example of a third installation position allocation step.

Note that, the present disclosure is not limited to the example described above, and it is possible to carry out the present disclosure in various modes subjected to various modifications and improvements based on the knowledge of a person skilled in the art. Specifically, for example, in the example described above, the tape feeder 50 is adopted as the feeder which supplies the electronic components; however, it is possible to adopt a bulk feeder or the like.

In the example described above, the installation position optimization program 150 is stored in the controller 132 and the installation position optimization program 150 is executed in the controller 132; however, the installation position optimization program 150 may be stored in a different information processing device from the mounting machine 10 or the like, and may be executed in the information processing device or the like.

REFERENCE SIGNS LIST

10: mounting machine (electronic component mounting machine), 20: conveyance device, 22: conveyance device, 24: supply device (component supply device), 26: supply device (component supply device), 28: moving device, 30: mounting head, 50: tape feeder (feeder), 52: tape feeder installation table (feeder installing section), 80: main body section, 81: nozzle holding unit, 110: nozzle holding unit, 112: nozzle holding unit, 150: installation position optimization program, 152: first installation position allocation step, 154: second installation position allocation step, 156: third installation position allocation step.

The invention claimed is:

1. A non-transitory medium storing an installation position optimization program which optimizes installation positions of a feeder on each feeder installation section of a pair of component supply devices in an electronic component mounting machine including a pair of conveyance devices which convey circuit boards;

a mounting head which performs mounting operation of electronic components on the circuit boards;

a moving device which moves the mounting head to an arbitrary position; and the pair of component supply devices, each of which includes the feeder installation section on which one or more of the feeders which store electronic components is installed in a detachable manner and supplies electronic components at a supply position of the electronic components of the feeder, wherein the pair of component supply devices is installed to interpose the pair of conveyance devices, wherein the mounting head includes a main body section which is held by the moving device to be capable of moving to an arbitrary position, and a plurality of nozzle holding units which hold one or more suction nozzles, wherein each of the plurality of nozzle holding units is mounted in the main body section in an exchangeable manner, wherein a nozzle height which is a height of a tip portion of the one or more suction nozzles from a top surface of the circuit board when the mounting head is moved above the circuit board by the moving device in a state in which the nozzle holding unit is mounted in the main body section is different for each of the plurality of nozzle holding units, and wherein the installation position optimization program comprises:

a first installation position allocation step of allocating an installation position of one or more specific feeders which is the feeder that stores the electronic components which are scheduled to be mounted onto the circuit board which is conveyed by one of the pair of conveyance devices to the feeder installation section of a first component supply device which is the component supply device which is close to the one of the pair of conveyance devices of the pair of component supply devices; and a second installation position allocation step of allocating, in a case in which the number of the one or more specific feeders exceeds the number of feeders which are installed on the feeder installation section of the first component supply device, the installation position of the feeder which stores the electronic components which are scheduled to be held by the one or more nozzles of the nozzle holding unit with the greatest nozzle height of the one or more specific feeders to the feeder installation section of a different component supply device from the first component supply device of the pair of component supply devices.

2. The non-transitory medium according to claim 1, wherein the installation position optimization program further comprises:

a third installation position allocation step of allocating, in a case in which the number of the one or more specific feeders exceeds the number of feeders which are installed on the feeder installation section of the first component supply device and the electronic components which are scheduled to be mounted onto the circuit board which is conveyed by the other of the pair of conveyance devices are the electronic components which are scheduled to be held by the one or more nozzles of the nozzle holding unit with the lowest nozzle height, the installation position of the feeder which stores the electronic components which are scheduled to be held by the one or more nozzles of a nozzle holding unit other than the nozzle holding unit with the lowest nozzle height of the one or more specific feeders to the feeder installation section of a different component supply device from the first component supply device of the pair of component supply devices.

3. An electronic component mounting machine which optimizes installation positions of a feeder on each feeder installation section of a pair of component supply devices in the electronic component mounting machine, comprising:

a pair of conveyance devices which convey circuit boards;
a mounting head which performs mounting operation of electronic components on the circuit boards;
a moving device which moves the mounting head to an arbitrary position; and
the pair of component supply devices, each of which includes the feeder installation section on which one or more of the feeders which store electronic components is installed in a detachable manner and supplies electronic components at a supply position of the electronic components of the feeder,
wherein the pair of component supply devices is installed to interpose the pair of conveyance devices,
wherein the mounting head includes
a main body section which is held by the moving device to be capable of moving to an arbitrary position, and
a plurality of nozzle holding units which hold one or more suction nozzles,
wherein each of the plurality of nozzle holding units is mounted in the main body section in an exchangeable manner,
wherein a nozzle height which is a height of a tip portion of the one or more suction nozzles from a top surface of the circuit board when the mounting head is moved above the circuit board by the moving device in a state in which the nozzle holding unit is mounted in the main body section is different for each of the plurality of nozzle holding units, and
wherein the electronic component mounting machine further comprises a controller configured to:
allocate an installation position of one or more specific feeders which is the feeder that stores the electronic components which are scheduled to be mounted onto the circuit board which is conveyed by one of the pair of conveyance devices to the feeder installation section of a first component supply device which is the component supply device which is close to the one of the pair of conveyance devices of the pair of component supply devices; and
allocate, in a case in which the number of the one or more specific feeders exceeds the number of feeders which are installed on the feeder installation section of the first component supply device, the installation position of the feeder which stores the electronic components which are scheduled to be held by the one or more nozzles of the nozzle holding unit with the greatest nozzle height of the one or more specific feeders to the feeder installation section of a different component supply device from the first component supply device of the pair of component supply devices.

4. The electronic component mounting machine according to claim 3, wherein the controller is configured to allocate, in a case in which the number of the one or more specific feeders exceeds the number of feeders which are installed on the feeder installation section of the first component supply device and the electronic components which are scheduled to be mounted onto the circuit board which is conveyed by the other of the pair of conveyance devices are the electronic components which are scheduled to be held by the one or more nozzles of the nozzle holding unit with the lowest nozzle height, the installation position of the feeder which stores the electronic components which are scheduled to be held by the one or more nozzles of a nozzle holding unit other than the nozzle holding unit with the lowest nozzle height of the one or more specific feeders to the feeder installation section of a different component supply device from the first component supply device of the pair of component supply devices.

* * * * *